United States Patent
Yu et al.

(10) Patent No.: US 11,239,201 B2
(45) Date of Patent: Feb. 1, 2022

(54) 3D INTEGRATED CIRCUIT (3DIC) STRUCTURE

(71) Applicant: Taiwan Semiconductor Manufacturing Company, Ltd., Hsinchu (TW)

(72) Inventors: Chen-Hua Yu, Hsinchu (TW); Wen-Chih Chiou, Zhunan Township (TW); Chung-Shi Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 66 days.

(21) Appl. No.: 16/435,697

(22) Filed: Jun. 10, 2019

(65) Prior Publication Data

US 2019/0295989 A1   Sep. 26, 2019

Related U.S. Application Data

(62) Division of application No. 14/591,784, filed on Jan. 7, 2015, now Pat. No. 10,319,701.

(51) Int. Cl.
*H01L 23/48* (2006.01)
*H01L 23/52* (2006.01)
(Continued)

(52) U.S. Cl.
CPC .......... *H01L 25/0657* (2013.01); *H01L 24/05* (2013.01); *H01L 24/16* (2013.01); *H01L 24/81* (2013.01); *H01L 25/50* (2013.01); *H01L 24/13* (2013.01); *H01L 2224/05558* (2013.01); *H01L 2224/05571* (2013.01); *H01L 2224/1147* (2013.01); *H01L 2224/11462* (2013.01); *H01L 2224/11464* (2013.01); *H01L 2224/13101* (2013.01); *H01L 2224/13147* (2013.01); *H01L 2224/1607* (2013.01);
(Continued)

(58) Field of Classification Search
CPC ......... H01L 24/05; H01L 24/16; H01L 24/81; H01L 25/50; H01L 24/27; H01L 25/0657; H01L 25/117; H01L 25/043; H01L 25/074; H01L 25/0756; H01L 21/768; H01L 21/486; H01L 21/76816; H01L 21/76898; H01L 23/488; H01L 2224/81948; H01L 2224/81007; H01L 2224/81801; H01L 2224/81947; H01L 2225/06513; H01L 2225/06517
USPC .......................... 257/737, 774, 778, 686, 777
See application file for complete search history.

(56) References Cited

U.S. PATENT DOCUMENTS

| | | | |
|---|---|---|---|
| 6,326,701 B1 | 12/2001 | Shinogi et al. | |
| 7,242,099 B2 * | 7/2007 | Lin | H01L 21/568 257/778 |

(Continued)

*Primary Examiner* — Caleb E Henry
*Assistant Examiner* — Dilinh P Nguyen
(74) *Attorney, Agent, or Firm* — Slater Matsil, LLP

(57) ABSTRACT

An embodiment bonded integrated circuit (IC) structure includes a first IC structure and a second IC structure bonded to the first IC structure. The first IC structure includes a first bonding layer and a connector. The second IC structure includes a second bonding layer bonded to and contacting the first bonding layer and a contact pad in the second bonding layer. The connector extends past an interface between the first bonding layer and the second bonding layer, and the contact pad contacts a lateral surface and a sidewall of the connector.

19 Claims, 15 Drawing Sheets

(51) Int. Cl.
  *H01L 25/065* (2006.01)
  *H01L 25/00* (2006.01)
  *H01L 23/00* (2006.01)

(52) U.S. Cl.
  CPC .............. *H01L 2224/16145* (2013.01); *H01L 2224/16225* (2013.01); *H01L 2224/81007* (2013.01); *H01L 2224/81141* (2013.01); *H01L 2224/81801* (2013.01); *H01L 2224/81815* (2013.01); *H01L 2224/81947* (2013.01); *H01L 2224/81948* (2013.01); *H01L 2225/06513* (2013.01); *H01L 2225/06541* (2013.01); *H01L 2924/14* (2013.01); *H01L 2924/381* (2013.01)

(56) References Cited

U.S. PATENT DOCUMENTS

| | | | |
|---|---|---|---|
| 7,385,283 B2 | 6/2008 | Wu et al. | |
| 7,564,115 B2 | 7/2009 | Chen et al. | |
| 7,633,165 B2 | 12/2009 | Hsu et al. | |
| 7,825,024 B2 | 11/2010 | Lin et al. | |
| 7,973,413 B2 | 7/2011 | Kuo et al. | |
| 8,105,875 B1 | 1/2012 | Hu et al. | |
| 8,158,456 B2 | 4/2012 | Chen et al. | |
| 8,183,578 B2 | 5/2012 | Wang | |
| 8,183,579 B2 | 5/2012 | Wang | |
| 8,227,902 B2 | 7/2012 | Kuo | |
| 8,278,152 B2 | 10/2012 | Liu et al. | |
| 8,426,961 B2 | 4/2013 | Shih et al. | |
| 8,669,174 B2 | 3/2014 | Wu et al. | |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,860,229 B1 | 10/2014 | Lin | |
| 2007/0037379 A1* | 2/2007 | Enquist | H01L 21/76898 438/618 |
| 2009/0263951 A1* | 10/2009 | Shibata | H01L 21/76816 438/422 |
| 2009/0273914 A1 | 11/2009 | Supriya et al. | |
| 2010/0264551 A1* | 10/2010 | Farooq | H01L 25/50 257/777 |
| 2012/0068355 A1 | 3/2012 | Aoki et al. | |
| 2012/0153484 A1* | 6/2012 | Sadaka | H01L 21/76826 257/762 |
| 2012/0228713 A1* | 9/2012 | Chen | H01L 27/092 257/369 |
| 2014/0001645 A1 | 1/2014 | Lin et al. | |
| 2014/0225258 A1 | 8/2014 | Chiu et al. | |
| 2014/0252572 A1 | 9/2014 | Hou et al. | |
| 2014/0252632 A1 | 9/2014 | Barth et al. | |

* cited by examiner

3D INTEGRATED CIRCUIT (3DIC) STRUCTURE

PRIORITY CLAIM AND CROSS-REFERENCE

This application is a divisional of U.S. patent application Ser. No. 14/591,784 filed Jan. 7, 2015, now U.S. Pat. No. 10,319,701, entitled "3D Integrated Circuit (3DIC) Structure and Method of Making Same," which application is hereby incorporated by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers or dies may be bonded together through suitable bonding techniques. An electrical connection may be provided between the stacked semiconductor wafers. The stacked semiconductor devices may provide a higher density with smaller form factors and allow for increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
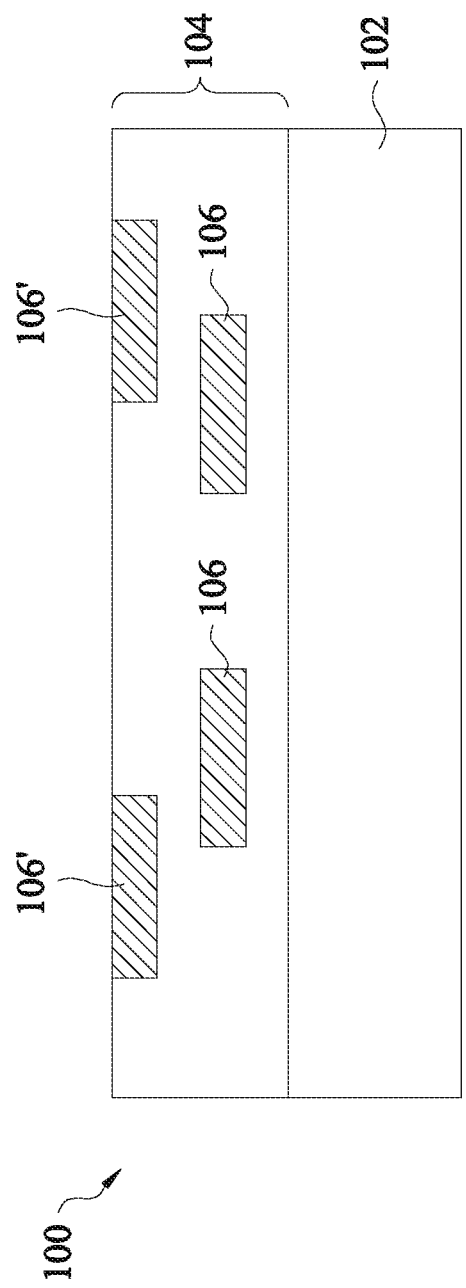
FIGS. 1A-1B, 2A-2B, 3A-3B, 4A-4B, 5A-5B, and 6-9 illustrate various intermediary stages of manufacturing a bonded integrated circuit structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include a bonded integrated circuit structure, which may include a first integrated circuit structure bonded to a second integrated circuit structure. The bonding of the integrated circuit structures may include a hybrid bonding process where both bonding layers (e.g., oxide-to-oxide bonding layers) and conductive interconnect structures are used. The conductive interconnect structures may include a concave contact pad (e.g., having a U-shape in a cross-sectional view), which may be used to contain the material of a connector (e.g., solder or copper bump) during bonding. In the bonded structure, the concave contact pad may contact a lateral surface and sidewalls of the connector. Thus, the risk manufacturing defects, such as, solder bridging may be reduced, which allows for conductive interconnect structures to be spaced closer together (e.g., have a smaller pitch), increasing I/O density and improving yield.

FIGS. 1A through 5B illustrate the formation of various structures for bonding two integrated circuit structures 100 and 150 prior to bonding. Although the figures illustrate an embodiment of a die-on-wafer bonding process, other embodiments may also be applied to die-on-die bonding, wafer-on-wafer bonding, and the like. FIGS. 1A and 1B illustrate a die 100 (see FIG. 1A) and a wafer 150 (see FIG. 1B) prior to bonding. In some embodiments, die 100 may be a semiconductor die and could be any type of integrated circuit, such as a processor, logic circuitry, memory, analog circuit, digital circuit, mixed signal, and the like. Similarly, wafer 150 may include any type of integrated circuits, such as a processor, logic circuitry, memory, analog circuit, digital circuit, mixed signal, and the like. The functionality provided by die 100 and wafer 150 may or may not be the same.

Throughout the FIGS. 1A through 5B, Figures ending in designation "A" illustrate die 100 and figures ending in designation "B" illustrate wafer 150 prior to bonding. Furthermore, although the figures and description describe the parallel formation of interconnect structures on die 100 and wafer 150, other embodiments may apply to the formation of such structures at different times. For example, interconnect structures (e.g., contacts 114, see FIG. 5A) in die 100 may be formed prior to, simultaneously, and/or after interconnect structures (e.g., contact pads 164, see FIG. 5B) in wafer 150. Although described as a die 100 throughout, one of ordinary skill will readily understand that some processing on die 100 may occur while die 100 is part of a larger substrate, for example, a wafer.

Die 100 and wafer 150 include a substrate 102 and a substrate 152, respectively. Substrates 102 and 152 may comprise, for example, bulk semiconductor, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Substrates 102 and/or 152 may include elementary semiconductor, such as silicon or germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Active devices such as transistors, capacitors, resistors, diodes, photo-diodes, fuses, and the like may be formed at the top surface of each substrate 102 and 152.

Interconnect layers 104 and 154 may be formed over the active devices and substrates 102 and 152, respectively. Interconnect layers 104 and 154 may include inter-layer dielectric (ILD) and/or inter-metal dielectric (IMD) layers containing conductive features 106 and 156 (e.g., conductive lines and vias comprising copper, aluminum, tungsten, combinations thereof, and the like), respectively, formed using any suitable method. The ILD and IMDs may include low-k dielectric materials having k values, for example, lower than about, 4.0 or even 2.0, disposed between such conductive features. In some embodiments, the ILD and IMDs may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). Interconnect layers 104 and 154 electrically connect various active devices to form functional circuits within die 100 and wafer 150, respectively. The functions provided by such circuits may include memory structures, processing structures, sensors, amplifiers, power distribution, input/output circuitry, or the like. The functions provided by circuits in die 100 and wafer 150 may or may not be the same. The above examples are provided for illustrative purposes only to further explain applications of various embodiments. Other circuitry may be used as appropriate for a given application.

Figure 1B:
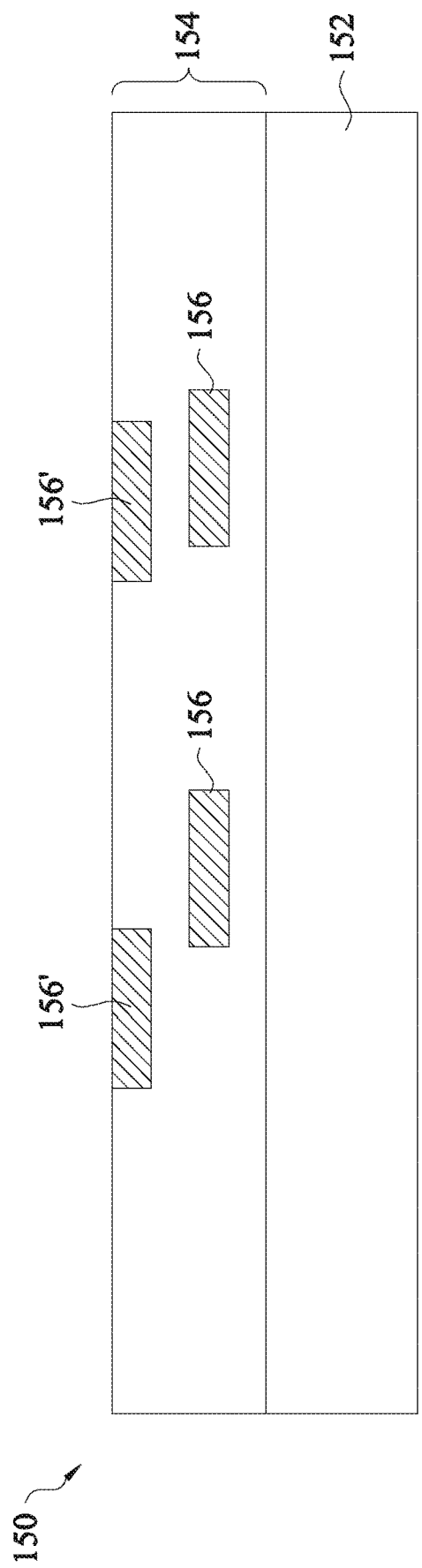

As further illustrated by FIGS. 1A and 1B, interconnect layer 104 of die 100 and interconnect layer 154 if wafer 150 may further include a top-most interconnect layer having conductive features 106' and 156', respectively. Conductive features 106' may be a metal line, contact pad, or the like disposed on a top surface of die 104. Similarly, conductive feature 156' may be a metal line, contact pad, or the like disposed on a top surface of wafer 150. The various features of die 100 and wafer 150 may be formed by any suitable method. Furthermore, the general features and configuration of die 100 and/or wafer 150 described above are but one example embodiment, and die 100 and/or wafer 150 may include any combination of any number of the above features as well as other features.

Figure 2A:
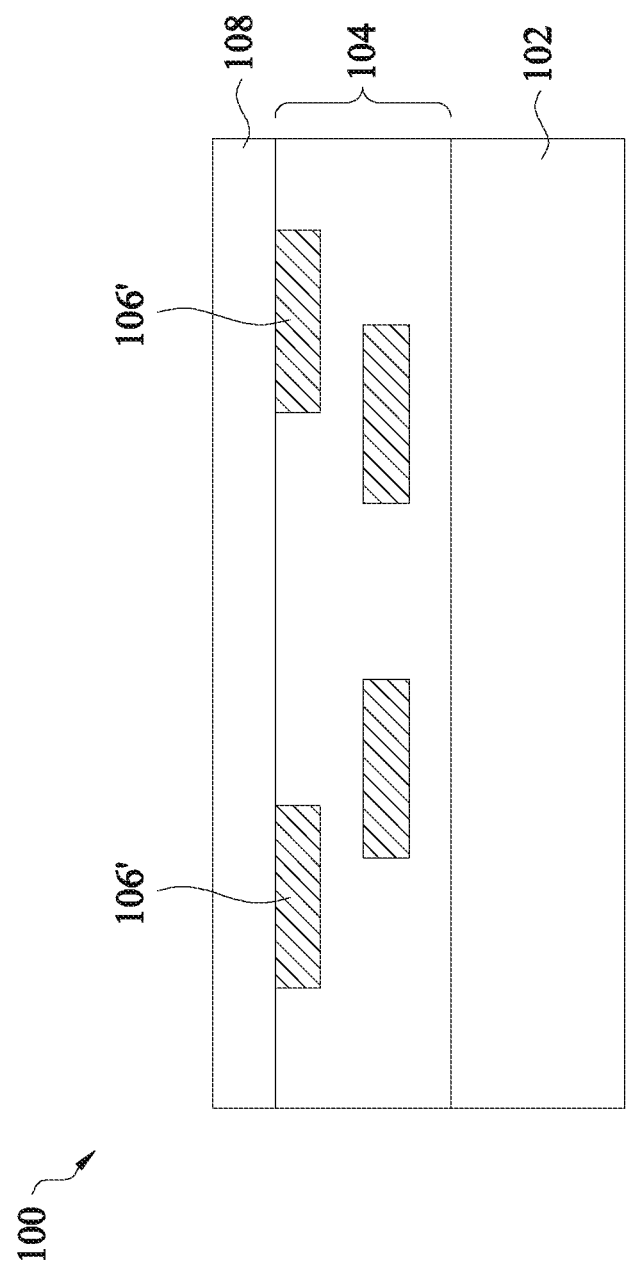
Figure 2B:
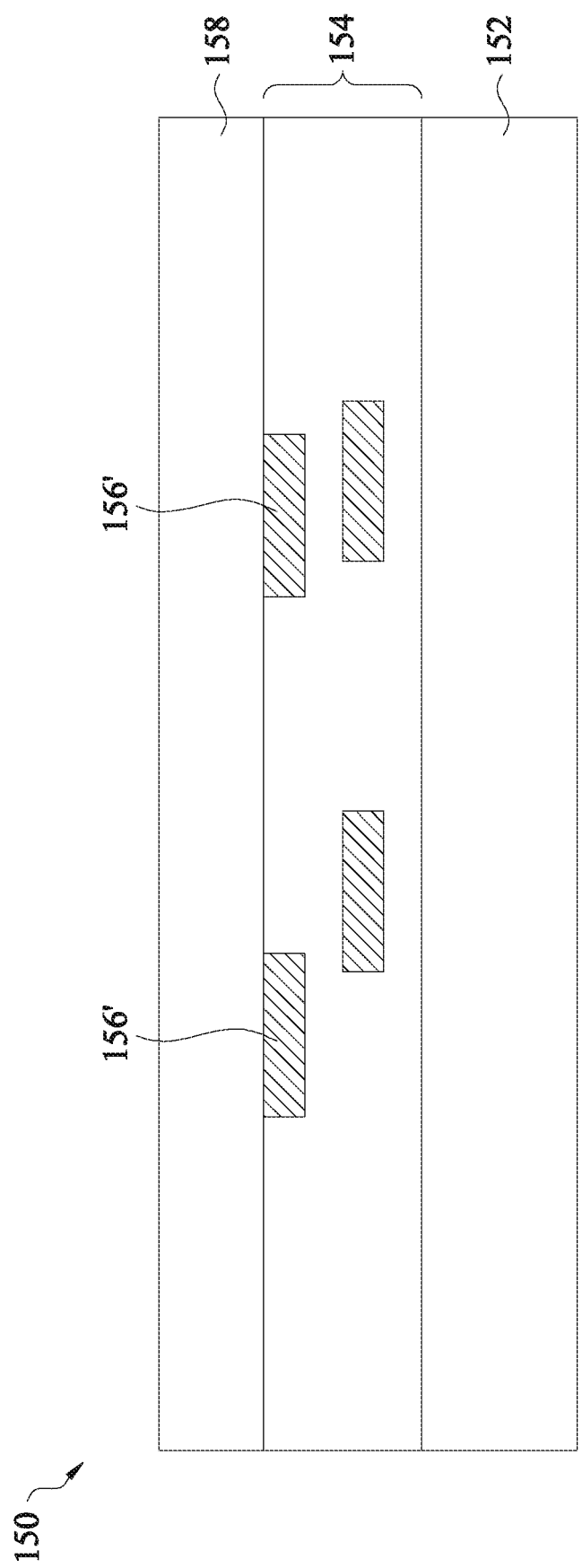

Referring next to FIGS. 2A and 2B, bonding layers 108 and 158 may be disposed on a top surface of die 100 and wafer 150, respectively. Bonding layer 108 may cover conductive feature 106', and bonding layer 158 may cover conductive feature 156'. In some embodiments, bonding layers 108 and 158 may include an oxide (e.g., silicon oxide, silicon oxynitride, and the like), which may be formed using a suitable deposition process, such as spinning, CVD, atomic layer deposition (ALD), plasma enhanced CVD, physical vapor deposition (PVD), and the like. In subsequent process steps, bonding layers 108 and 158 may be used to bond die 100 to wafer 150 in a hybrid bonding process, for example. In some embodiments, bonding layers 108 and 158 may further function as a passivation layer.

Figure 3A:
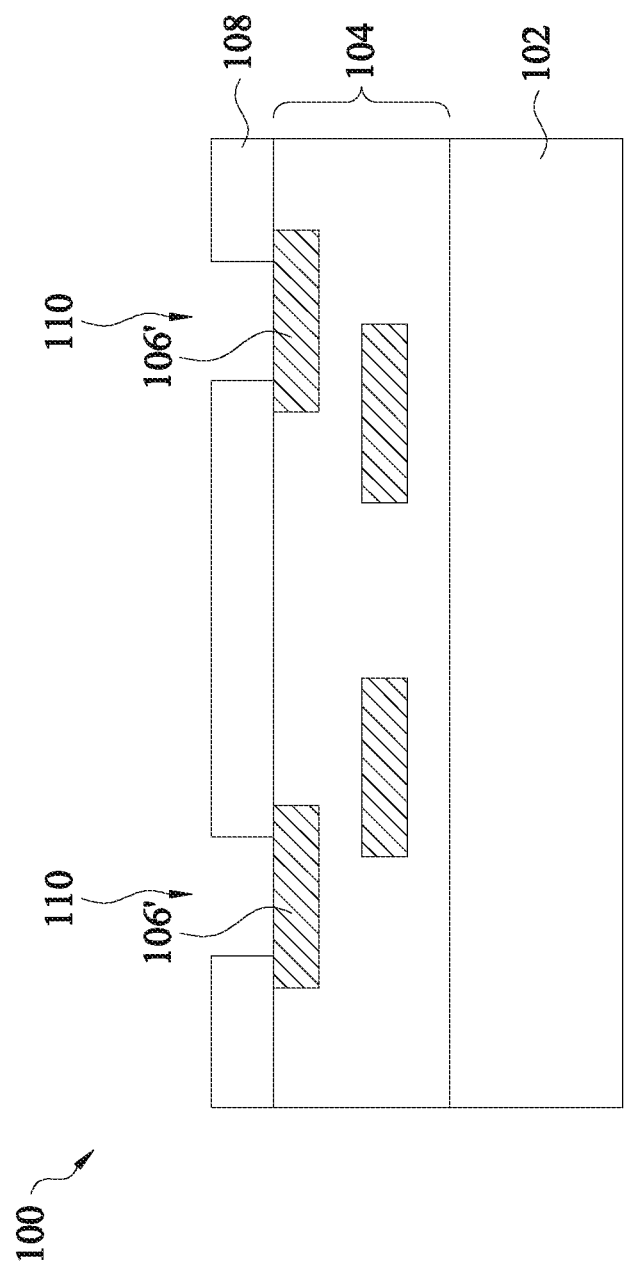
Figure 3B:
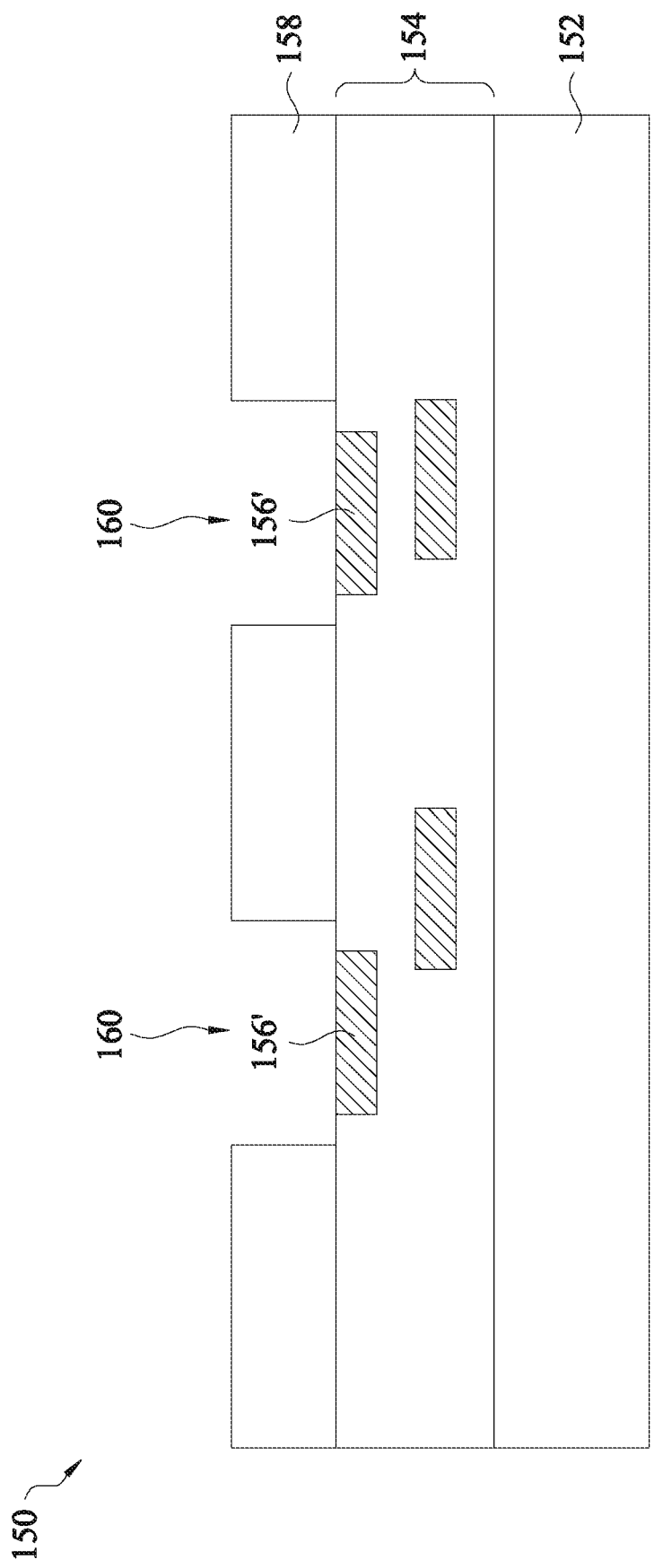

Subsequently, as illustrated in FIGS. 3A and 3B, bonding layers 108 and 158 are patterned to include openings 110 and 160 exposing conductive features 106' and 156', respectively. The patterning of bonding layers 108 and 158 may include photolithography and etching processes. For example, photoresists (not shown) may be blanket deposited over bonding layers 108 and 158, and the photoresists may be exposed, e.g., to light, using a photomask. Exposed or unexposed portions of the photoresists may then be removed depending on whether a positive or negative resist is used. Thus, the photoresists may be patterned to include openings, which may correspond to openings 110 and 160.

Subsequently, the pattern of the photoresists may be transferred to bonding layers 108 and 158 using etching processes. Thus, openings 110 exposing conductive features 106' may be patterned in bonding layer 108, and openings 160 exposing conductive features 156' may be patterned in bonding layer 158. The etching may be any acceptable etch process, such as a reactive ion etch (RIE), neutral beam etch (NBE), the like, or a combination thereof. The etching may be anisotropic. Subsequently, the photoresists are removed in an ashing and/or wet strip process(es), for example. In some embodiments, hard masks (not shown) might be formed between the photoresists and bonding layers 108 and 158, in which embodiments the pattern from the photoresists would first be imposed upon the hard masks and the patterned hard masks would be used in patterning the underlying layers 108 and/or 158.

Figure 4A:
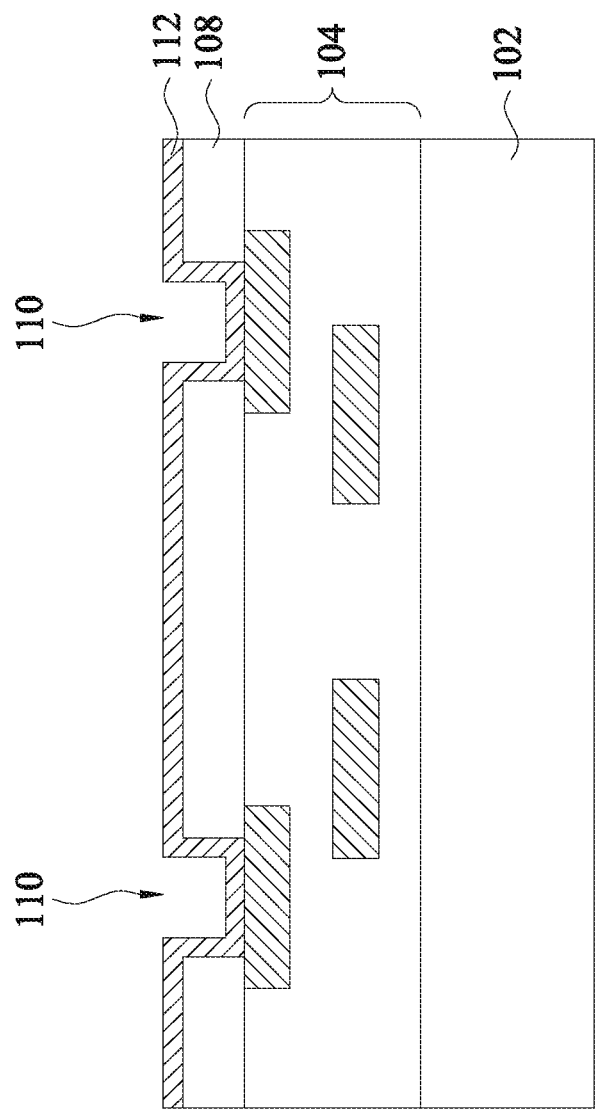

FIG. 4A illustrates the formation of a seed layer 112 over die 100 using any suitable method, such as sputtering, CVD, PVD, electroless plating, and the like. In an embodiment, seed layer 112 is a conformal layer. The formation of seed layer 112 may cover a top surface of bonding layer 108 in die 100. In some embodiments, seed layer 112 may comprise a conductive material, such as, solder, copper, alloys thereof, combinations thereof, and the like, for example. Seed layer 112 may be disposed in openings 110 and may contact underlying conductive features 106'. Conductive features 106' may electrically connect seed layer 112 to the circuits in die 100.

Figure 4B:
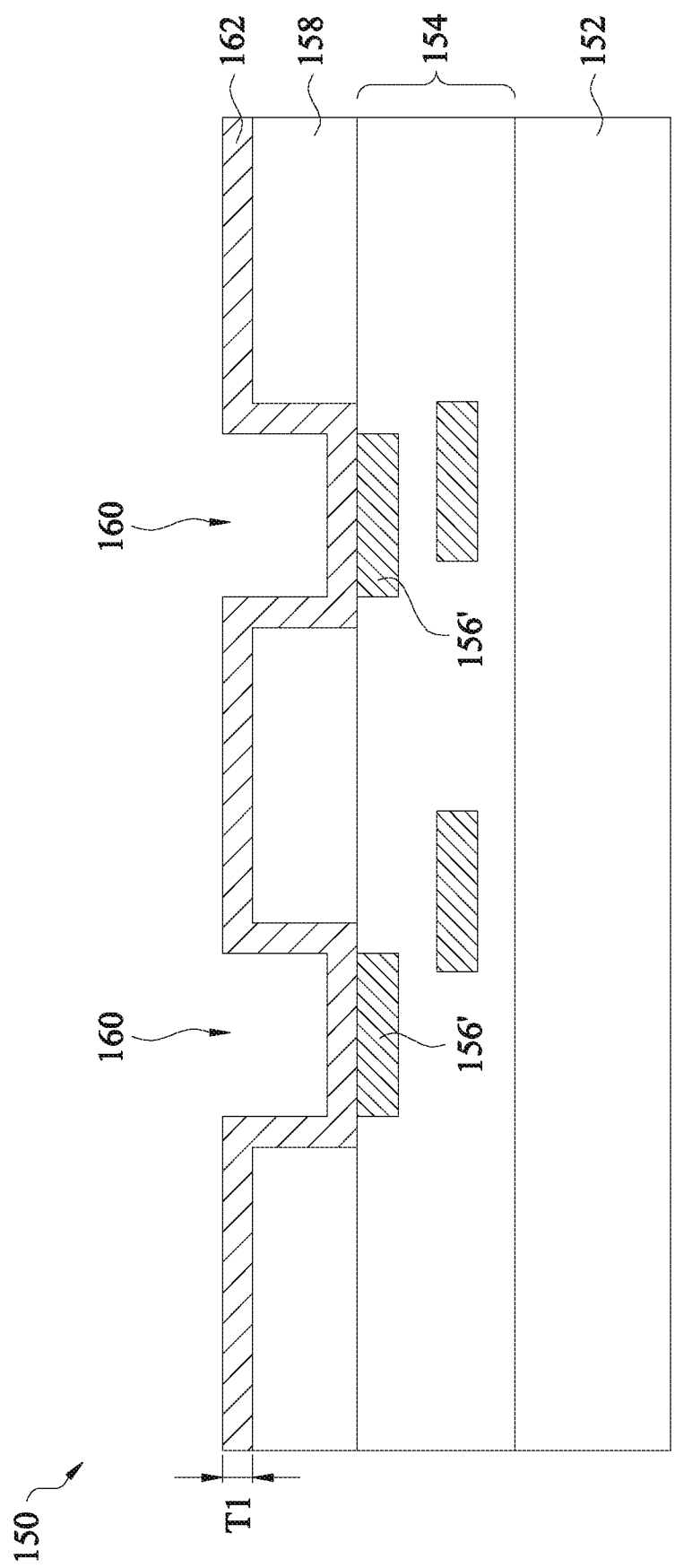

Similarly, FIG. 4B illustrates the formation of a conductive layer 162 over a top surface of wafer 150 using any suitable blanket deposition process, such as, sputtering, CVD, PVD, electroless plating, and the like. In some embodiments, conductive layer 162 comprises copper, nickel, gold, tin, silver, aluminum, alloys thereof, combinations thereof, and the like, for example. Conductive layer 162 may be a conformal layer disposed on sidewalls and a bottom surface of openings 160. Thus, conductive layer 162 may contact underlying conductive feature 156', which may electrically connect conductive layer 162 to the circuits in wafer 150. In some embodiments, conductive layer 162 may have a thickness T1 of about 500 Å to about 8000 Å, for example. As illustrated by FIG. 4B, conductive layer 162 may cover a top surface of bonding layer 158 in wafer 150.

Figure 5A:
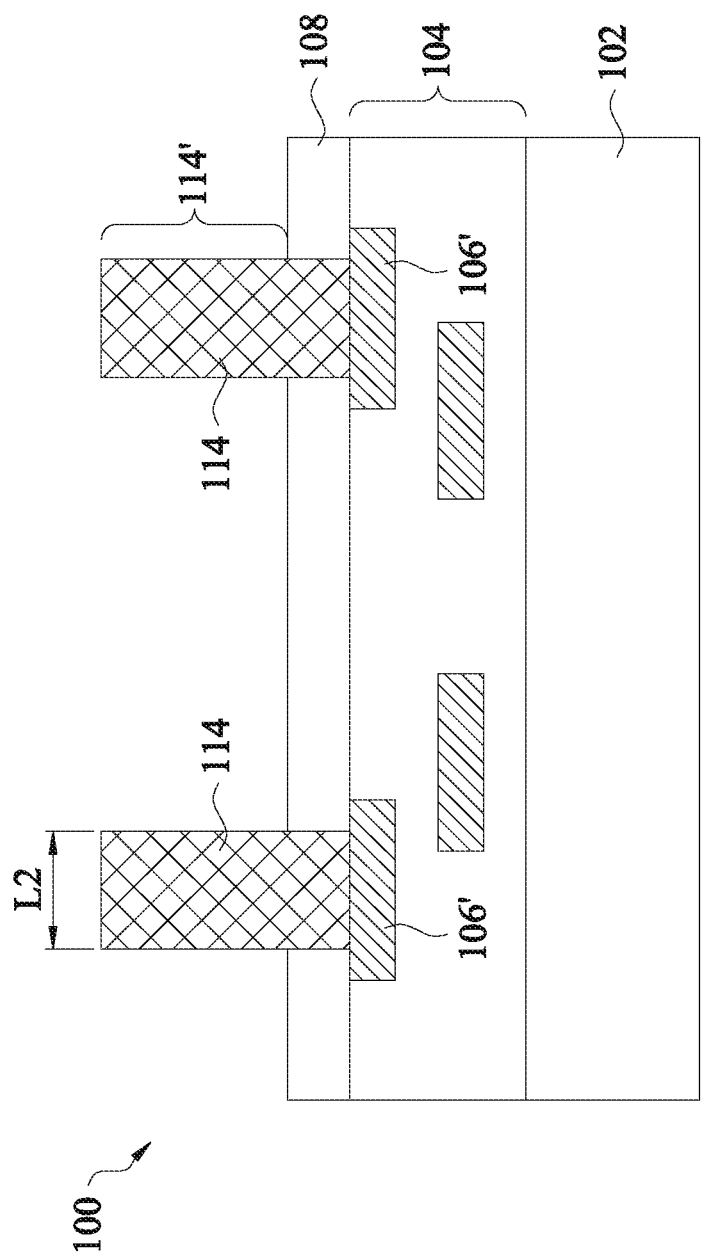
Figure 5B:
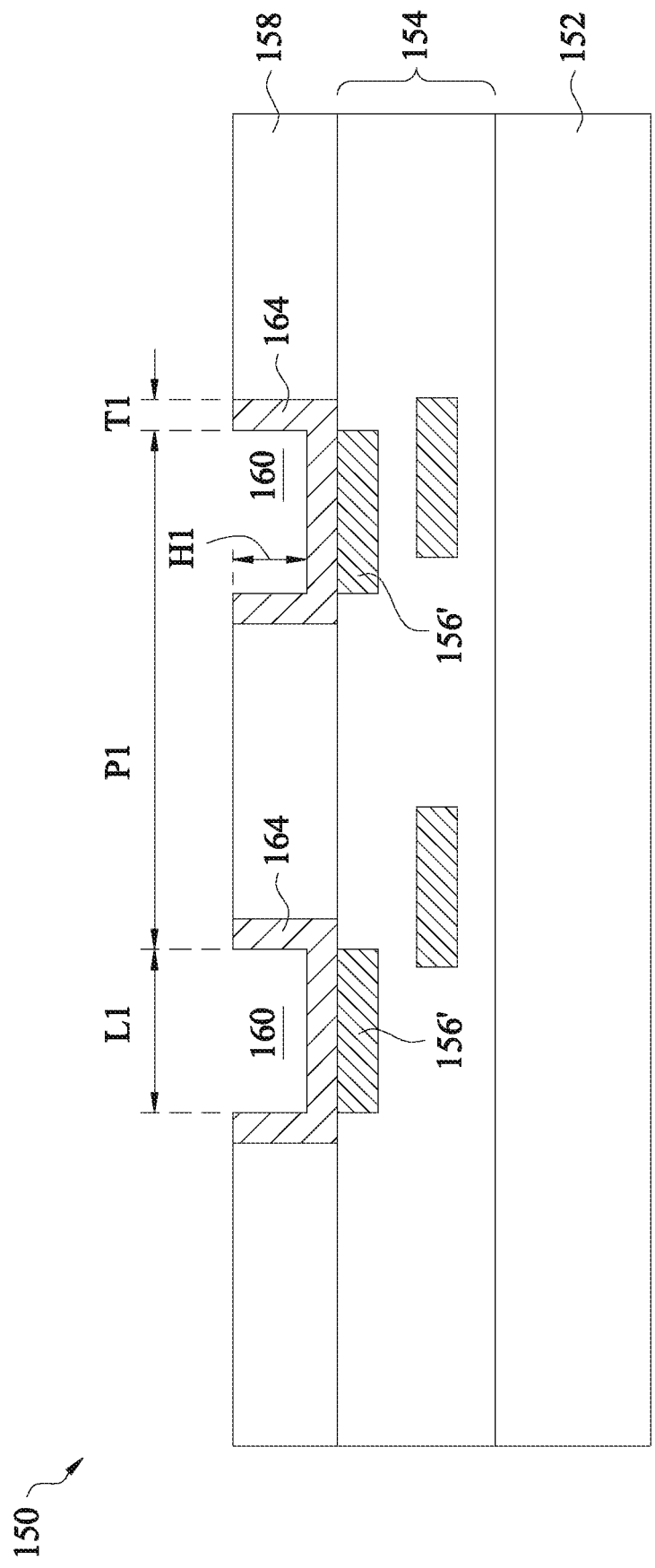

FIGS. 5A and 5B illustrate the formation of interconnect features in die 100 and wafer 150. FIG. 5A illustrates the formation of convex connectors 114 (e.g., a conductive pillar or bump) by applying a plating process (e.g., electroless plating, electrochemical plating, and the like) on seed layer 112. During the plating process, a mask (e.g., a photoresist or hard mask, not shown) may be disposed over die 100 to define a shape of connectors 114. The plating process may consume seed layer 112 in openings 110 and thus, seed layer 112 is not separately illustrated in FIG. 5A. The resulting connectors may fill openings 110 and extend past a top surface of die 100. After forming connectors 114, excess portions of seed layer 112 (e.g., outside of openings 110) may be removed using a suitable process, such as, photolithography and/or etching, for example. In some embodiments, connectors 114 may comprise solder, copper, combinations thereof, and the like.

FIG. 5B illustrates the removal of portions of conductive layer 162 over bonding layer 158 using any suitable planarization process. For example, a chemical mechanical polish (CMP), grinding, or other suitable process may be used. Because conductive layer 162 covers a top surface of wafer 150, defects caused by the planarization process (e.g., CMP) due to differences in pattern density, material mismatch, and the like may be reduced.

In the resulting structure, remaining portions of conductive layer 162 in openings 160 forms contact pads 164, which may be concave in configuration. For example, in the illustrated cross-sectional view, contact pads 164 have a U-shape, and in a top-down view (not shown), wafer 150 includes contact pads 164 surrounding openings 160, which may be circular, elliptical, or the like in shape. Contact pads 164 may be disposed on a sidewall and bottom surface of openings 160, and contact pads 164 may be electrically connected to underlying conductive features 156'. In various embodiments, contact pads 164 may not completely fill openings 160, and openings 160 may only be partially filled. For example, after the formation of contact pads 164, openings 160 may have a lateral dimension L1 of about 0.5 µm to about 20 µm and a vertical dimension H1 of about 2 µm or less. As illustrated, lateral dimension L1 may be defined as the horizontal dimension of openings 160 between inner sidewalls of a contact pad 164. Furthermore, vertical dimension V1 may be defined as a vertical dimension between an exposed, top surface of contact pad 164 to a top surface of bonding layer 158. Throughout the description, the terms "horizontal" or "lateral" are defined as a direction parallel to a major surface (e.g., a surface having active devices) of substrates 102/152 whereas "vertical" is defined as a direction perpendicular to the major surface of substrates 102/152. The terms "horizontal", "lateral", and "vertical" are relative and not meant to impose any sort of absolute orientation.

In subsequent process steps, connector 114 may be disposed in remaining portions of opening 160 during the bonding of die 100 to wafer 150. Thus, the dimensions of connector 114 and opening 160 may be related. For example, a portion of connector 114 extending past bonding layer 108 (labeled portion 114') may have an area of about 95% to about 100% of the area of opening 160. Furthermore, in order to allow connector 114 to be disposed within opening 160, a lateral dimension L2 of connector 114 may be less than lateral dimension L1 of opening 160. In some embodiments, lateral dimension L2 may be about 60% to about 80% of lateral dimension L1. For example, in embodiments where lateral dimension L1 is about 0.5 µm, lateral dimension L2 may be about 0.4 µm or less. As another example, in embodiments where lateral dimension L1 is about 3.5 µm, lateral dimension L2 may be about 2 µm or less. In some embodiments, the relative value of lateral dimension L1 in relation to lateral dimension L2 may depend on the bonding accuracy for bonding die 100 to 150. For example, when higher bonding accuracy can be achieved, a ratio of lateral dimension L2 to lateral dimension L1 may be increased.

Due to the configuration of contact pads 164 and bonding layer 158, contact pads 164 may be used to contain the material (e.g., solder) of connector 114 during the bonding of die 100 to wafer 150. Thus, connectors 114 and contact pads 164 may be spaced relatively close together without the risk of connector bridging (e.g., solder bridging). For example, a pitch P1 between neighboring contact pads 164 may be less than about 10 µm or even less than about 5 µm. In embodiments where features of die 100 is part of a larger substrate (e.g., a wafer), a singulation process may be applied to separate die 100 from other features (e.g., other dies) in the substrate.

Figure 6:
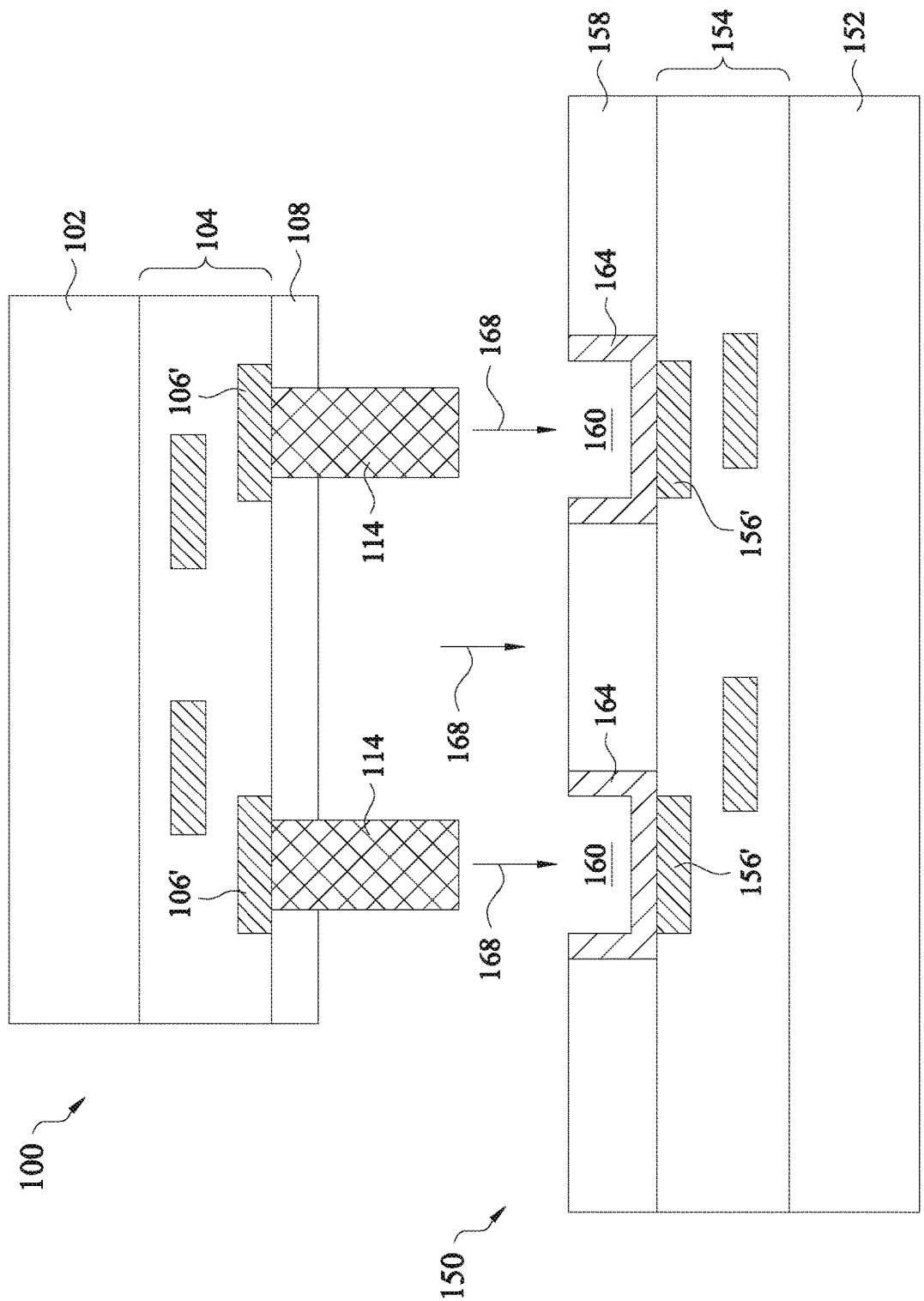
Figure 7:
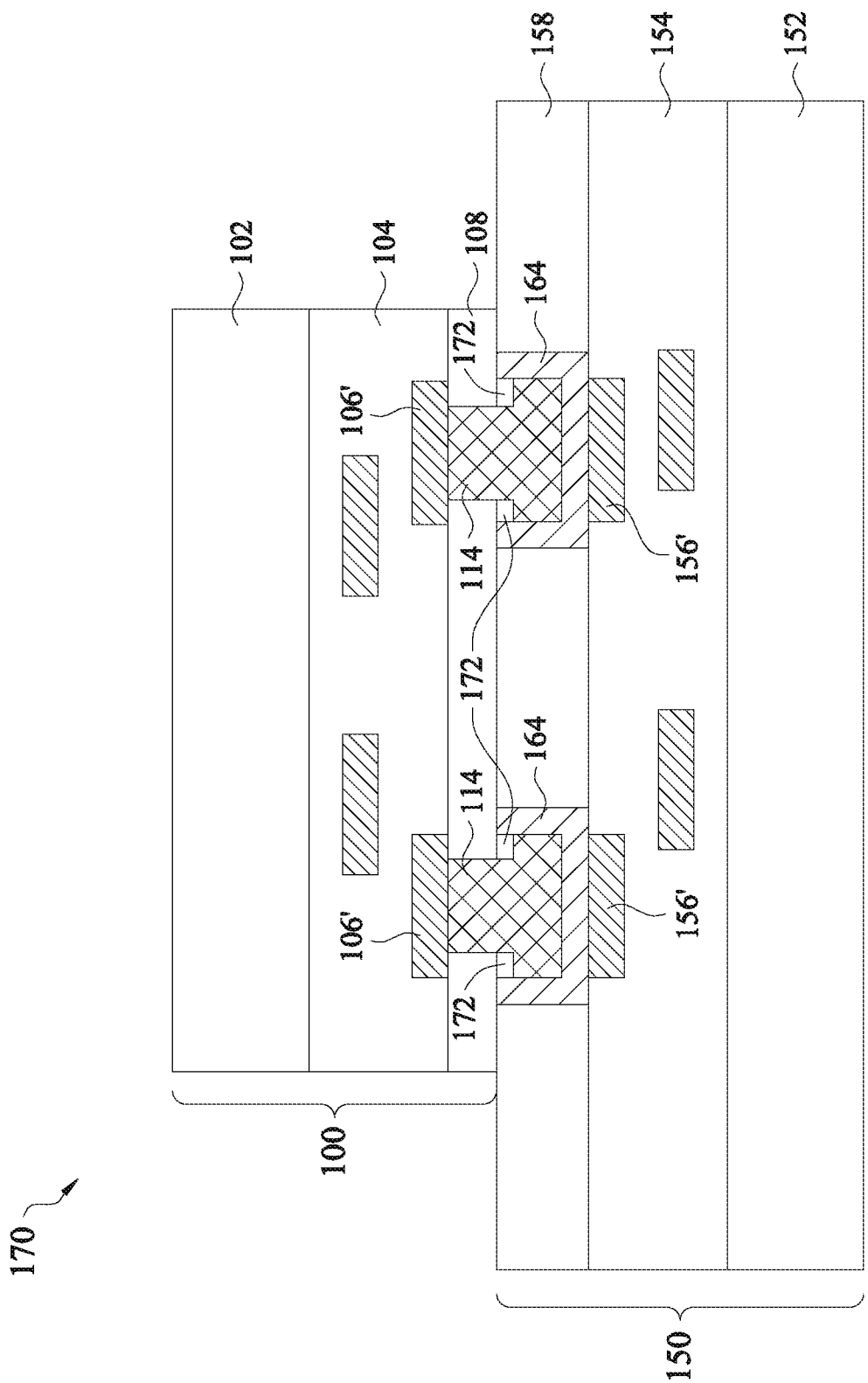

FIGS. 6 and 7 illustrate the bonding of die 100 and wafer 150 using a hybrid bonding process, for example. In FIG. 6, a pre-bonding process is illustrated. Die 100 and wafer 150 may be orientated so that connectors 114 and respective contact pads 164 face each other. For example, in the illustrated embodiment, die 100 may be disposed so that bonding layer 108 is orientated downwards. During pre-bonding, die 150 may be heated to a pre-bonding temperature less than the melting temperature of connectors 114. For example, die 150 may be heated to a pre-bonding temperature of about 150° Celsius (C) to about 200° C. Die 100 may then be contacted to wafer 150 so that bonding layers 108 and 158 are in physical contact as indicated by arrows 168. By heating die 150, hydrogen bonds may be formed between bonding layers 108 and 158 when die 100 is contacted to wafer 150. Furthermore, during pre-bonding connectors 114 may be aligned with openings 160 so that connectors 114 are disposed in openings 160 after bonding (see e.g., FIG. 7).

Subsequently, in FIG. 7, an annealing process is applied bonding die 100 to wafer 150, thus forming bonded integrated circuit structure 170. In some embodiments, the annealing process may be conducted at a suitably high temperature to melt and bond connectors 114 to contact pads 164. The annealing process may further form covalent bonds between bonding layers 108 and 158 in a bonding process. For example, the annealing process may include heating die 100 and wafer 150 to a temperature of about 250° C. to about 300° C. and maintaining this temperature for about an hour. Connectors 114 may extend past an interface between die 100 and wafer 150. As discussed above, the shape of contact pads 164 may be used to contain the material of connectors 114 during bonding from undesired lateral spreading. For example, in the bonded integrated circuit structure 170, contact pads 164 may be disposed on a lateral (e.g., bottom) surface and sidewalls of connectors 114. Furthermore, the material of connectors 114 may not spread between bonding layers 108 and 158. Thus, the risk manufacturing defects (e.g., bridging) may be reduced, allowing for interconnect structures having a smaller pitch between connectors 114 and contact pads 164. Bonded connectors 114 and contact pads 164 may electrically connect circuits in die 100 to circuits in wafer 150.

In the resulting structure, portions (e.g., sidewall portions) of contact pads 164 may contact bonding layer 108. However, due to the annealing process, the conductive material of connectors 114 may suffer shrinkage, which may result in the presence of air gaps 172 at the interface between die 100 and wafer 150. Such air gaps 172 may be disposed between bonding layer 108 and contact pads 164/portions of connectors 114 in openings 160. For example, in some embodiments, a volume of the material of connectors 114 may shrink by about 5% to about 6%, and the volume of air gaps 172 may be about 5% to about 10% of the volume of connector 114 in openings 160. The presence of air gaps 172 may advantageously be used for stress relaxation at the interface between die 100 and wafer 150 as well as to reduce air trapping within the conductive material of connector 114. Thus, in some embodiments, the volume of connectors 114 prior to bonding may be controlled to intentionally form air gaps 172. In other embodiments, air gaps 172 may be omitted.

Figure 8:
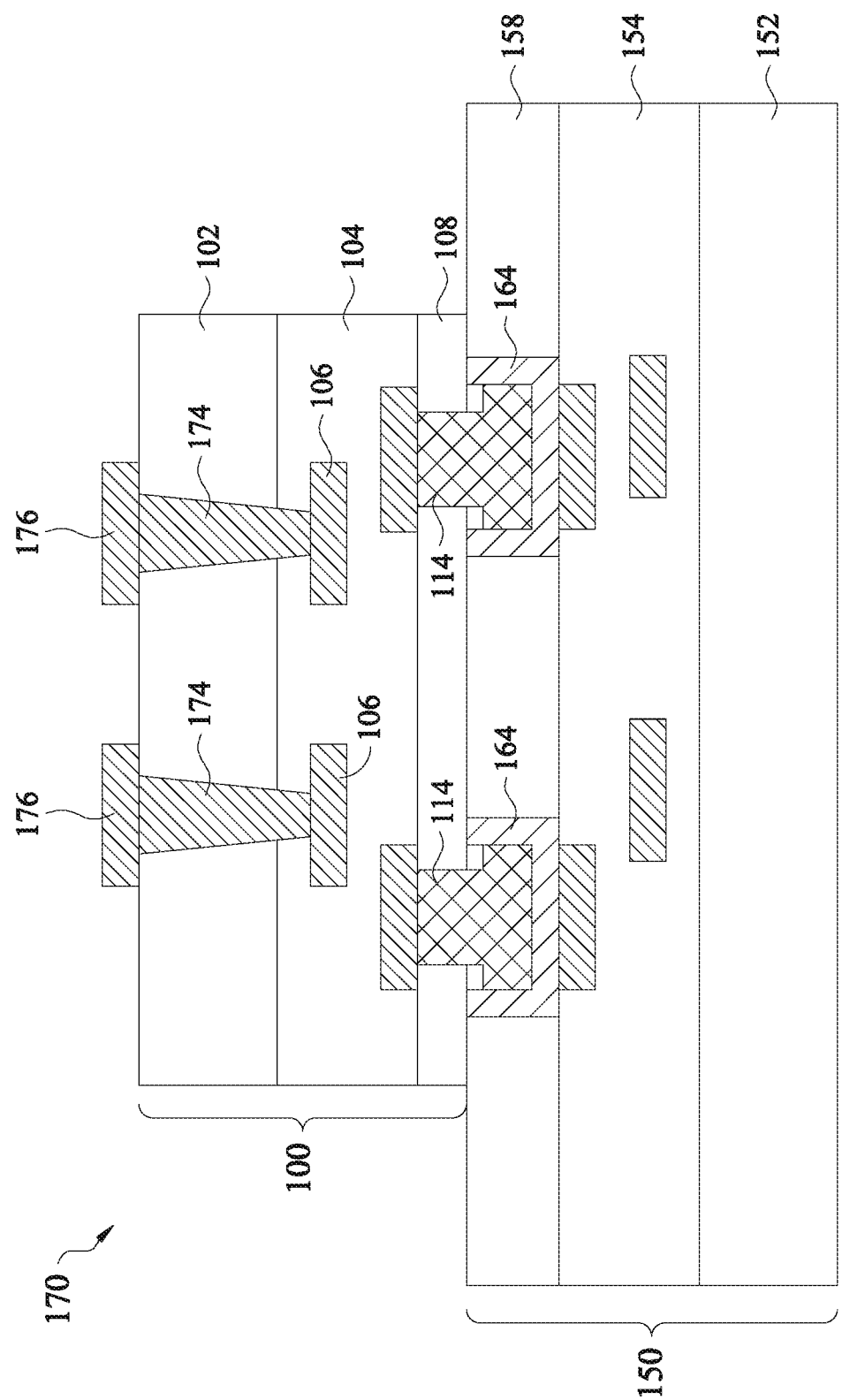

FIG. 8 illustrates the optional formation of additional structures in bonded integrated circuit structure 170. For example, through substrate vias (TSVs, sometimes also referred to as through silicon vias or through vias) 174 may be formed in die 100. TSVs 174 may be electrically connected to conductive features 106 in interconnect layers 104. TSVs 174 may be formed using any suitable process. For example, a patterning process (e.g., photolithography and etching processes) may be used to pattern substrate 102 and/or one or more interconnect layers 104 to expose conductive features 106. Subsequently, barrier and/or a seed layers (not shown) may be deposited in the openings, and the openings may be filled with a conductive material to form TSVs 174 using a plating process, for example. Backside contact pads 176 may also be formed on TSVs 174. In some embodiments, the formation of contact pads 176 may include using a hard mask to define a shape of contact pads 176, depositing a seed layer, plating the contact pads, and removing the hard mask.

Figure 9:
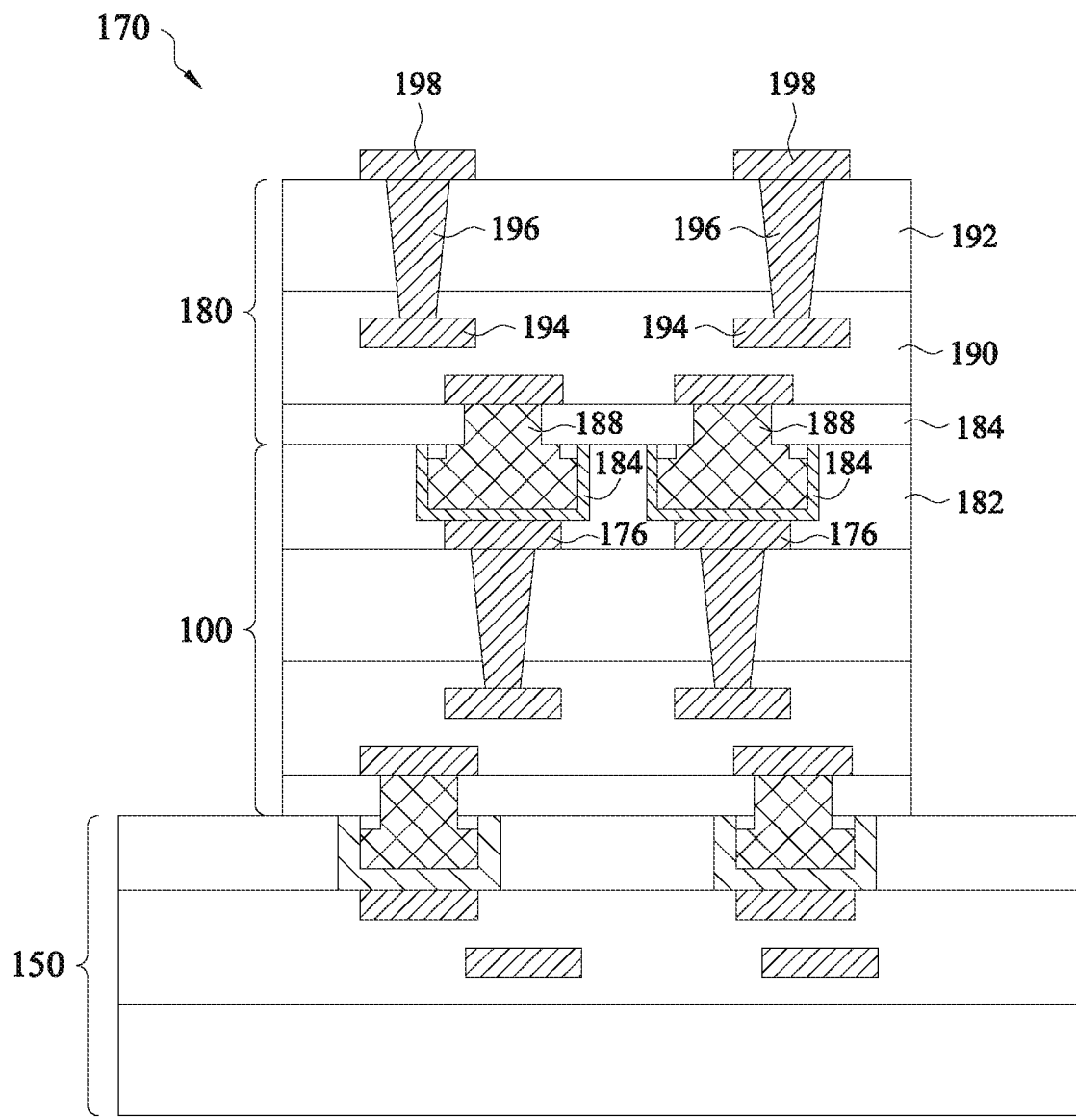

Contact pads 176 may be used to electrically connect bonded integrated circuit structure 170 to other components. For example, connector elements, such as solder balls (not shown) may be used to connect contact pads 176 to other package components, such as, interposers, package substrates, fan-out redistribution layers (RDLs), and the like. As another example, contact pads 176 may be used to bond another integrated circuit die to bonded integrated circuit 170. For example, FIG. 9 illustrates the optional bonding of another integrated circuit structure (die 180) to die 100 using contact pads 176. Die 180 may be similar to die 100, and die 180 may include a substrate 192 and interconnect layers 190 having conductive features 194. The bonding of dies 180 and 100 may use a similar process (e.g., hybrid bonding) as that described above for the bonding of die 100 to wafer 150. In such embodiments, bonding layers 182 and 186 (e.g., oxide layers) may be used to bond die 180 to a surface of die 100 opposing wafer 150. Furthermore, concave contact pads 184 may be used to bond to and contain the material of connectors 188, and connectors 188/contact pads 184 may electrically connect die 180 to die 100. Additional features, such as TSVs 196 (e.g., electrically connected to conductive features 194) and additional contact pads 198 may be formed in die 180. Contact pads 198 may be used to electrically connect bonded integrated circuit structure to other package components, such as, additional dies, interposers, package substrates, fan-out RDLs, and the like. Additional processing may be performed, for example, to singulate portions of wafer 150 along scribe lines.

Figure 10:
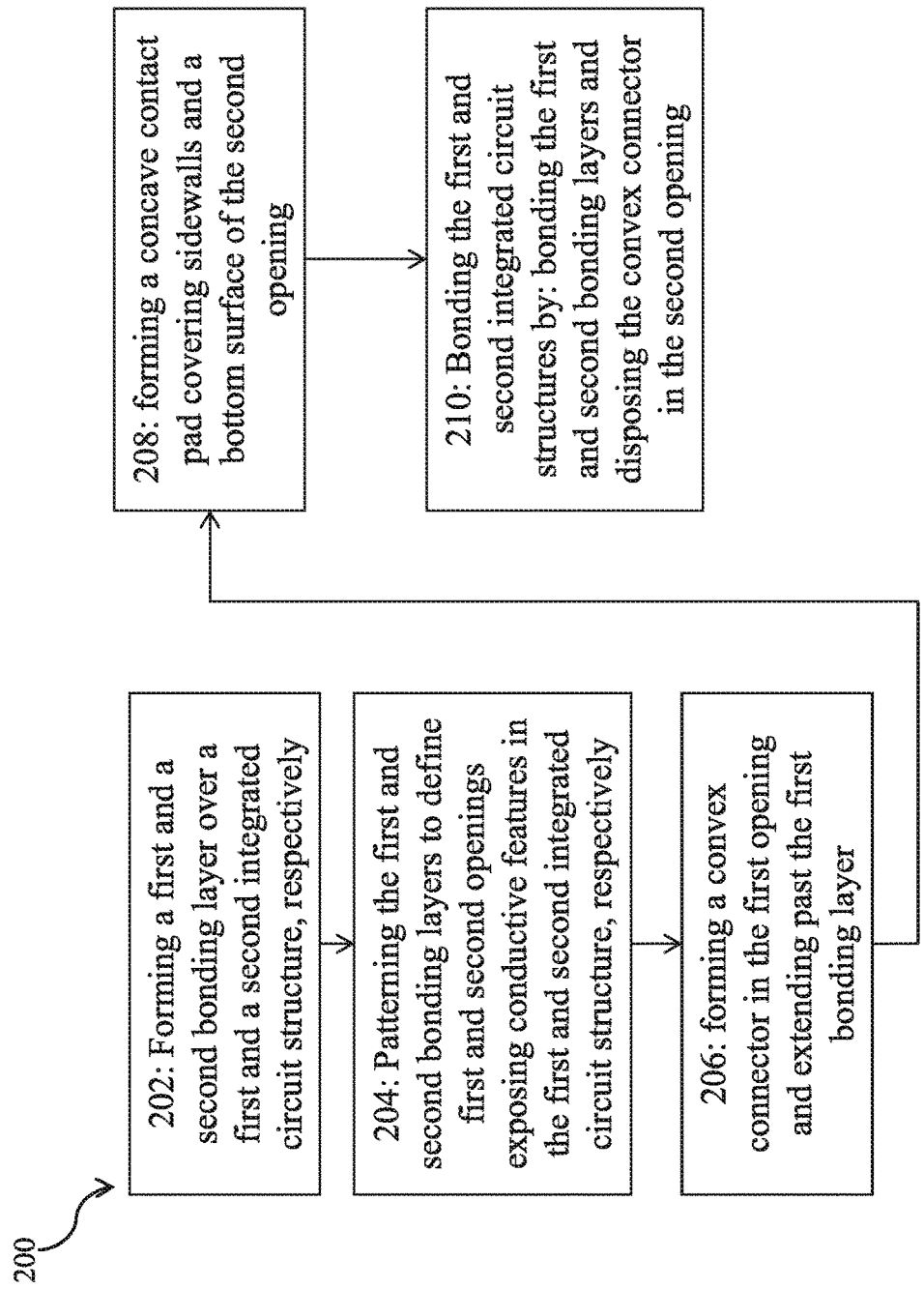
FIG. 10 illustrates a process flow for forming the bonded integrated circuit in accordance with some embodiments.

FIG. 10 illustrates an example process 200 for forming a bonded integrated circuit structure in accordance with some embodiments. In step 202, a first bonding layer (e.g., layer 108) is formed over a first integrated circuit structure (e.g., die 100), and a second bonding layer (e.g., layer 158) is formed over a second integrated circuit structure (e.g., wafer 150). In step 204, the first and second bonding layers are patterned to include first openings (e.g., openings 110) and second openings (e.g., openings 160), respectively. The first openings may expose conductive features (e.g., conductive features 106') in the first integrated circuit structure, and the second openings may expose conductive features (e.g., conductive features 156') in the second integrated circuit structure.

Next, in step 306, convex connectors (e.g., connector 114) are formed in the first openings. The connectors are referred to as convex because they may extend past a surface of the first bonding layer. The connectors are electrically connected to the exposed conductive features. In step 308, concave contact pads (e.g., contact pads 164) are formed in the second opening. The contact pads are referred to as concave because they cover sidewalls and bottom surfaces of the second openings while only partially filling the second openings. In step 310, the first and second integrated circuit structures are bonded using a hybrid bonding process. The hybrid bonding process may include bonding the first and second bonding layers (e.g., the first and second bonding layers may be contacted together and may be annealed to form covalent bonds). The hybrid bonding process may further include bonding the convex connectors to the concave contact pads by disposing the convex connectors in remaining portions of the second openings. In some embodiments, the shape of the concave contact pads may advantageously contain the material of the connectors during annealing to prevent manufacturing defects, such as solder bridging, and the like.

Various embodiments include a bonded integrated circuit structure, which may include two or more bonded integrated circuit structures (e.g., die-on-die bonding, wafer-on-wafer bonding, and/or die-on-wafer bonding). The bonding of the integrated circuit structures may include a hybrid bonding process where bonding layers (e.g., oxide-to-oxide bonding layers) are disposed on each integrated circuit and bonded to other bonding layers using a bonding process, for example. Electrical connection between each integrated circuit structure may be achieved using conductive interconnect structures disposed between each integrated circuit structure. Such conductive interconnect structures include a concave contact pad (e.g., having a U-shape in a cross-sectional view), which may be used to contain the material of a convex connector (e.g., a solder or copper bump) during bonding. In the bonded structure, the concave contact pad may contact a bottom surface and sidewalls of the connector. Thus, the risk manufacturing defects, such as, solder bridging may be reduced, which allows for conductive interconnect structures to be spaced closer together (e.g., have a smaller pitch), increasing I/O density and improving yield.

In accordance with an embodiment, a bonded integrated circuit (IC) structure includes a first IC structure and a second IC structure bonded to the first IC structure. The first IC structure includes a first bonding layer and a connector. The second IC structure includes a second bonding layer bonded to and contacting the first bonding layer and a contact pad in the second bonding layer. The connector extends past an interface between the first bonding layer and the second bonding layer, and the contact pad contacts a lateral surface and a sidewall of the connector.

In accordance with another embodiment, a method includes patterning a first opening in a first bonding layer of a first IC structure and patterning a second opening in a second bonding layer of a second IC structure. The method further includes forming a connector in the first opening and forming a contact pad on sidewalls and a bottom surface of the second opening. The connecter extends past a lateral surface of the first bonding layer. The first and the second IC structures are bonded. Bonding the first and the second IC structures includes fusion bonding the first bonding layer to the second bonding layer and bonding the connector to the contact pad. The connector is partially disposed in the second opening.

In accordance with yet another embodiment, a bonded integrated circuit (IC) structure includes a first semiconductor substrate, a first bonding layer over the first semiconductor substrate, and a contact pad in the first bonding layer. The bonded IC structure further includes a second bonding layer over and contacting the first bonding layer, a connector disposed in the first bonding layer and the second bonding layer, and a second semiconductor substrate over the second bonding layer. The contact pad is disposed on a lateral surface and a sidewall of the connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A bonded integrated circuit (IC) structure comprising:
   a first IC structure comprising a first bonding layer and a connector; and
   a second IC structure bonded to the first IC structure, wherein the second IC structure comprises:
      a second bonding layer covalently bonded to and contacting the first bonding layer, wherein the connector extends past an interface between the first bonding layer and the second bonding layer; and
      a contact pad in the second bonding layer, wherein the contact pad contacts a lateral surface and a sidewall of the connector, wherein the contact pad does not extend past the interface between the first bonding layer and the second bonding layer.

2. The bonded IC structure of claim 1, wherein the contact pad extends from the interface between the first bonding layer and the second bonding layer to an opposing surface of the second bonding layer from the first bonding layer.

3. The bonded IC structure of claim 2, wherein a lateral surface of the contact pad is substantially level with the opposing surface of the second bonding layer.

4. The bonded IC structure of claim 1, further comprising an air gap between the contact pad and the first bonding layer.

5. The bonded IC structure of claim 1, wherein the connector comprises solder, copper, or a combination thereof.

6. The bonded IC structure of claim 1, wherein the first bonding layer and the second bonding layer each comprise an oxide.

7. The bonded IC structure of claim 1, wherein the connector is partially disposed in the first bonding layer.

8. The bonded IC structure of claim 7, wherein a first lateral dimension of the contact pad is larger than a second lateral dimension of the connector in the first bonding layer.

9. A bonded integrated circuit (IC) structure comprising:
   a first semiconductor substrate;
   a first bonding layer over the first semiconductor substrate, the first bonding layer having a first surface;
   a contact pad in the first bonding layer, wherein the contact pad does not extend past the first surface of the first bonding layer;
   a second bonding layer covalently bonded to the first surface of the first bonding layer;
   a connector disposed in the first bonding layer and the second bonding layer, wherein the contact pad is disposed on a lateral surface and a sidewall of the connector; and
   a second semiconductor substrate over the second bonding layer.

10. The bonded IC structure of claim 9 further comprising an air gap at an interface between the first bonding layer and the second bonding layer.

11. The bonded IC structure of claim 9 further comprising:
   a plurality of first interconnect layers between the first semiconductor substrate and the first bonding layer, wherein the contact pad contacts a first conductive feature in the plurality of first interconnect layers; and
   a plurality of second interconnect layers between the second semiconductor substrate and the second bonding layer, wherein the connector contacts a first conductive feature in the plurality of second interconnect layers.

12. The bonded IC structure of claim 9, wherein a first lateral dimension of the connector in the first bonding layer is larger than a second lateral dimension of the connector in the second bonding layer.

13. The bonded IC structure of claim 9, wherein the second bonding layer is hybrid bonded to the first bonding layer.

14. A device comprising:
   a first Integrated Circuit (IC) structure comprising a first bonding layer, the first bonding layer having a first recess;
   a second IC structure comprising a second bonding layer, the second bonding layer having a second recess, and further comprising a contact pad extending on a sidewall and a bottom surface of the second recess, wherein the first bonding layer of the first Integrated Circuit (IC) structure is covalently bonded to the second bonding layer of the second IC structure, wherein a surface of the contact pad closest to the first bonding layer is level with a surface of the second bonded layer that is bonded to the first bonded layer; and
   a conductive connector extending from a surface in the first recess to a surface of the contact pad in the second recess.

15. The device of claim 14, further comprising an air gap in the second recess.

16. The device of claim 15, wherein the first bonding layer forms a surface of the air gap.

17. The device of claim 14, wherein a width of the second recess is greater than a width of the first recess.

18. The device of claim 14, wherein the first recess exposes a first conductive element of the first IC structure and wherein the conductive connector in the first recess physically contacts the first conductive element.

19. The device of claim 14, wherein the conductive connector in the second recess has a first portion near the first bonding layer that has a smaller lateral area than a second portion near the bottom surface of the second recess.

* * * * *